US007777322B2

(12) United States Patent
Curran et al.

(10) Patent No.: US 7,777,322 B2
(45) Date of Patent: Aug. 17, 2010

(54) APPARATUS FOR PROVIDING A LIGHT SOURCE THAT COMBINES DIFFERENT COLOR LEDS

(75) Inventors: John W. Curran, Lebanon, NJ (US); John Patrick Peck, Manasquan, NJ (US); Peter Goldstein, East Windsor, NJ (US)

(73) Assignee: Dialight Corporation, Farmingdale, NJ (US)

( * ) Notice: Subject to any disclaimer, the term of this patent is extended or adjusted under 35 U.S.C. 154(b) by 161 days.

(21) Appl. No.: 11/618,552

(22) Filed: Dec. 29, 2006

(65) Prior Publication Data

US 2007/0164268 A1 Jul. 19, 2007

Related U.S. Application Data

(60) Provisional application No. 60/755,704, filed on Dec. 30, 2005.

(51) Int. Cl.
*H01L 23/02* (2006.01)

(52) U.S. Cl. ....................... 257/686; 257/678; 257/693; 359/618; 359/634

(58) Field of Classification Search ................. 257/678, 257/686, 693, E25.032, E33.056; 359/618, 359/634
See application file for complete search history.

(56) References Cited

U.S. PATENT DOCUMENTS

| | | | | |
|---|---|---|---|---|
| 4,003,081 | A | 1/1977 | Hilsum et al. | |
| 5,200,844 | A | 4/1993 | Suvada | |
| 5,555,492 | A | 9/1996 | Feger | |
| 6,560,470 | B1 * | 5/2003 | Pologe | 600/310 |
| 6,641,283 | B1 | 11/2003 | Bohler | |
| 6,805,600 | B2 | 10/2004 | Wang et al. | |
| 6,961,190 | B1 | 11/2005 | Tamaoki et al. | |
| 7,196,354 | B1 * | 3/2007 | Erchak et al. | 257/79 |
| 7,239,449 | B2 * | 7/2007 | Leitel et al. | 359/618 |
| 7,602,057 | B2 | 10/2009 | Curran et al. | |
| 7,722,220 | B2 | 5/2010 | Van De Ven | |
| 2003/0180037 | A1 | 9/2003 | Sommers | |
| 2004/0012027 | A1 | 1/2004 | Keller et al. | |
| 2004/0041998 | A1 | 3/2004 | Haddad | |
| 2005/0046850 | A1 * | 3/2005 | Chow | 356/430 |
| 2005/0259409 | A1 | 11/2005 | Pohlert et al. | |
| 2006/0028122 | A1 | 2/2006 | Wang et al. | |
| 2006/0256049 | A1 * | 11/2006 | Schou | 345/82 |

(Continued)

OTHER PUBLICATIONS

PCT Search Report and Written Opinion for PCT/US06/62752; dated Apr. 28, 2008, copy consists of 11 pages.

(Continued)

*Primary Examiner*—Phuc T Dang

(57) ABSTRACT

A method for creating an improved signal light is disclosed. For example, the improved signal light includes a housing, one or more first type of light emitting diodes (LEDs) emitting a light energy having a first dominant wavelength deployed in the housing, one or more second type of LEDs emitting a light energy having a second dominant wavelength deployed in the housing, a filter and a mixer. The filter may filter the light energy of the one or more second type of LEDs such that only a third dominant wavelength passes from the one or more second type of LEDs. The mixer may mix the light energy having the first dominant wavelength and the filtered light energy having the third dominant wavelength to form a light energy having a desired fourth dominant wavelength.

22 Claims, 5 Drawing Sheets

U.S. PATENT DOCUMENTS

| | | | | |
|---|---|---|---|---|
| 2006/0270081 | A1* | 11/2006 | Chua et al. | 438/29 |
| 2007/0046850 | A1* | 3/2007 | Wang | 349/56 |
| 2007/0164268 | A1 | 7/2007 | Curran et al. | |
| 2007/0223018 | A1* | 9/2007 | Lammers et al. | 358/1.9 |
| 2008/0048200 | A1 | 2/2008 | Mueller et al. | |

OTHER PUBLICATIONS

International Search Report and Written Opinion for PCT/US2009/037721; copy consists of 8 unnumbered pages, dated May 19, 2009.

* cited by examiner

APPARATUS FOR PROVIDING A LIGHT SOURCE THAT COMBINES DIFFERENT COLOR LEDS

RELATED APPLICATIONS

This application claims priority under 35 U.S.C. § 119(e) to U.S. provisional patent application Ser. No. 60/755,704, filed on Dec. 30, 2005, which is hereby incorporated by reference in its entirety.

BACKGROUND OF THE INVENTION

1. Field of the Invention

The present invention generally relates to a light source, and more particularly to a light-emitting diode (LED) based signal lights. The present invention provides for a method of creating a more efficient signal light.

2. Description of the Related Art

Signal lights, such as yellow traffic lights or rail signals for example, provide visual indications. Previous yellow LED lights generally exhibit relatively poor energy efficiencies due to high degradation in light output at extreme temperatures, high or low. For example, traffic signal head temperatures can exceed 74 degrees Celsius (° C.) due to solar loading. The internal heating of each colored module of a traffic signal also contributes to the temperature rise.

Consequently, poor energy efficiencies may increase material costs, energy costs, and reduces the signal light life due to internal heating of electronic components. Reduced efficiencies may also limit the light intensity of the signal and create safety risks. Proper intensity levels are required, for example, on warm days with high solar loading as well as cooler days.

Therefore, there is a need in the art for an improved signal light, e.g. a traffic signal light, rail signal light and the like.

SUMMARY OF THE INVENTION

In one embodiment, the present invention provides a method for creating an improved traffic signal light. For example, the signal light comprises a housing, one or more first type of light emitting diodes (LEDs) emitting a light energy having a first dominant wavelength deployed in said housing, one or more second type of LEDs emitting a light energy having a second dominant wavelength deployed in said housing, a filter, wherein said filter filters said light energy of said one or more second type of LEDs such that only a third dominant wavelength passes from said one or more second type of LEDs and a mixer, wherein said mixer mixes said light energy having said first dominant wavelength and said filtered light energy having said third dominant wavelength to form a light energy having a desired fourth dominant wavelength.

An exemplary method of creating the signal light comprises providing one or more first type of light emitting diodes (LEDs) emitting a light energy having a first dominant wavelength. In addition, one or more second type of LEDs emitting a light energy having a second dominant wavelength is provided. Then, said light energy of said one or more second type of LEDs is filtered such that only a third dominant wavelength passes from said one or more second type of LEDs. Subsequently, said light energy having said first dominant wavelength and said filtered light energy having said third dominant wavelength are mixed to form a light energy having a desired fourth dominant wavelength. Finally, a light energy having said desired fourth dominant wavelength is emitted.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

Figure 1:
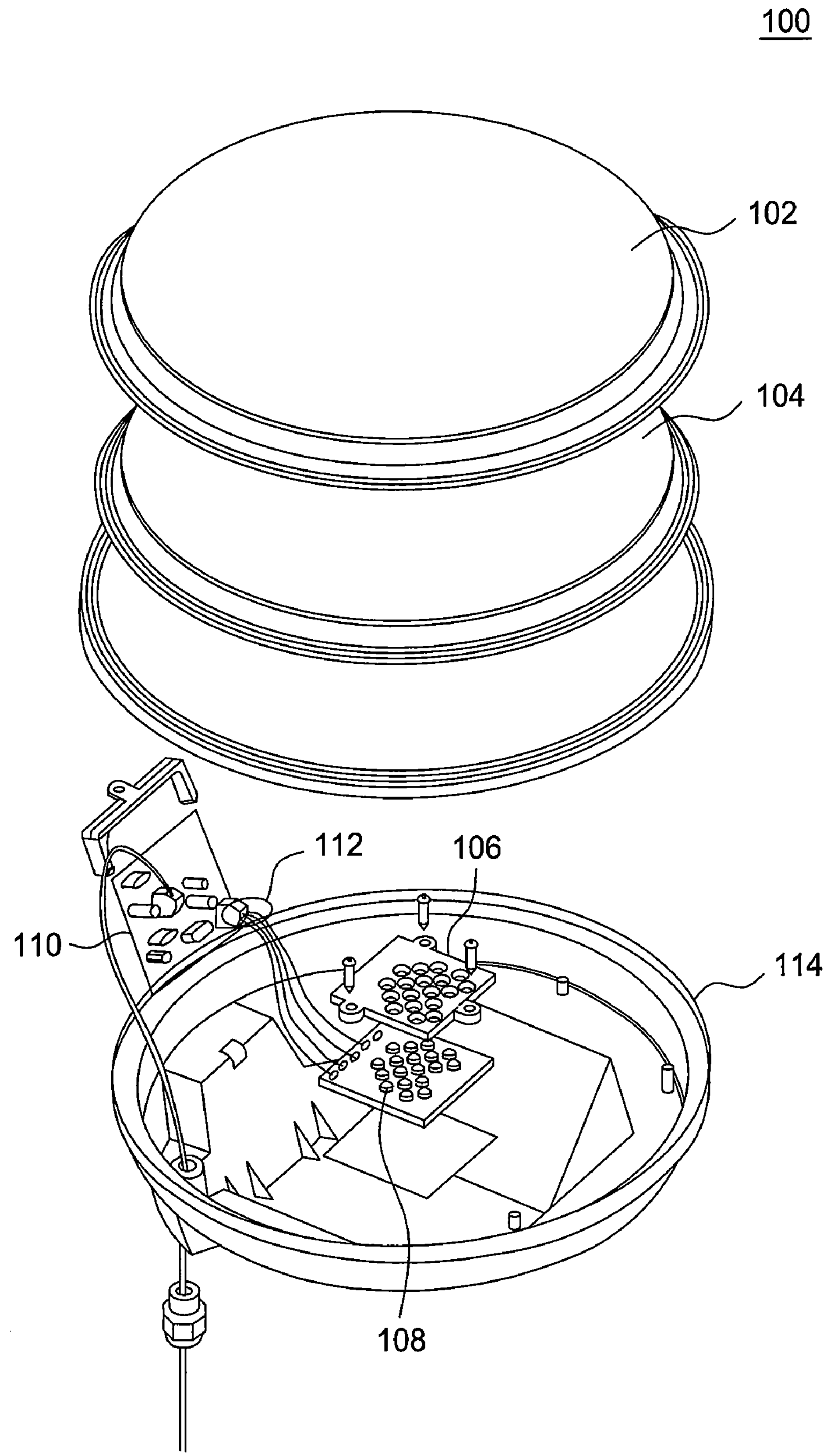
FIG. 1 illustrates an exploded view of an exemplary traffic signal light according to one embodiment of the present invention.
Figure 2:
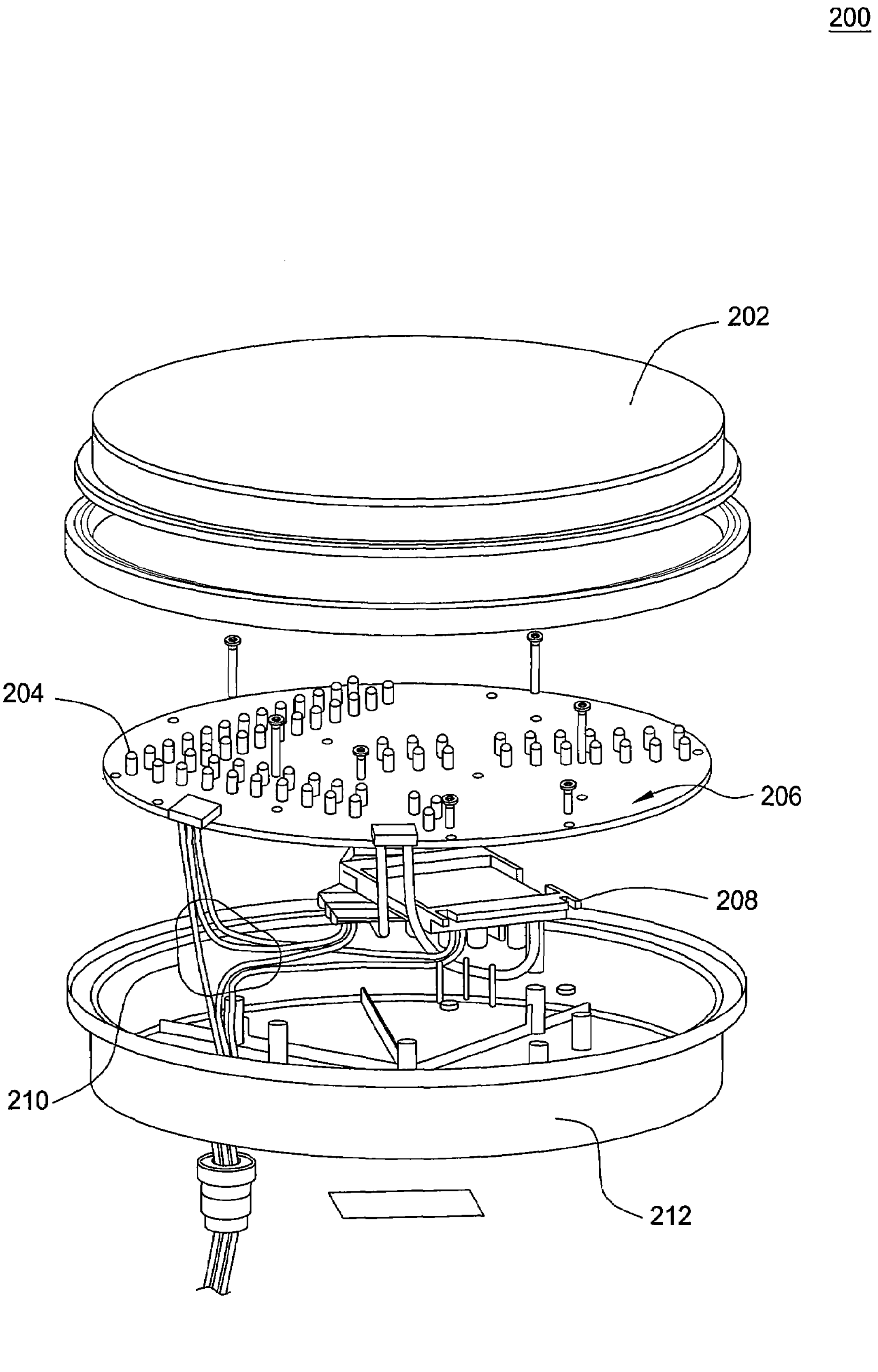
FIG. 2 illustrates an exploded view of another exemplary traffic signal light according to one embodiment of the present invention.

FIG. 1 illustrates an exploded view of an exemplary traffic signal light 100 according to one embodiment of the present invention. Traffic signal light 100 may comprise an outer lens 102, a mixing lens 104 such as, a Fresnel lens for example, and an array of light emitting diodes (LED)108. In the exemplary embodiment depicted in FIG. 1, LEDs 108 may be high powered LEDs such as, for example, Hi-Flux LEDs. LEDs 108 may also be 5 millimeter (mm) discrete LEDs, as depicted in FIG. 2 and discussed below.

The outer lens 102 may be smooth or may have a scattered surface depending on if the outer lens 102 simultaneously serves as a filter (not shown) and/or serves as the mixing lens 104, as discussed below. The outer lens 102 may also comprise optical features to help diffract light into a desired angular direction.

LEDs 108 may be placed in a reflector 106. Reflector 106 may comprise individual reflector cups for each one of the LEDs 108. LEDs 108 may comprise one or more first type of LEDs and one or more second type of LEDs. The one or more first type of LEDs may emit a light energy having first dominant wavelength peak, for example a dominant wavelength peak of approximately 595 nanometers (nm) having an orange-yellow color. The one or more second type of LEDs may emit a light energy having a second dominant wavelength peak, for example a dominant wavelength peak of approximately 450 nm having a perceived white color via use of a blue LED coated with a yellow phosphor. Hereinafter, “white LEDs” refer to the perceived white color via use of a blue LED coated with a yellow phosphor, discussed above. Although orange-yellow and white colored LEDs are used in exemplary embodiments of the present invention, one skilled in the art will recognize that any combination of color LEDs may be used within the scope of the present invention.

In an exemplary embodiment of the present invention, the one or more first type of LEDs and the one or more second type of LEDs may be placed adjacently in reflector 106 in an alternating fashion. However, embodiments of the present invention are not limited to such an arrangement and LEDs 108 may be placed in reflector 106 in any way.

Reflector 106 may be connected to a circuit board 110 via a plurality of wires 112. Circuit board 110 may include a processor for controlling the LEDs 108 on reflector 106. The reflector 106, the circuit board 110 and the plurality of wires 112 may be enclosed in a housing 114.

Traffic signal light 100 may also comprise a filter (not shown). The filter may be integrated into the outer lens 102, may be a separate lens located anywhere between the LEDs 108 and the outer lens 102 or may be placed directly over each of the LEDs 108. The filter may be a colored filter or a dichroic filter. Filtering may be performed in any method as is well known in the art of traffic signal light filtering.

In an exemplary embodiment, the filter may filter the one or more second type of LEDs emitting the light energy having the second dominant wavelength peak such that only a third dominant wavelength peak passes from the one or more second type of LEDs. For example, if the second type of LEDs are white colored LEDs, then unfiltered white LEDs may have a dominant wavelength peak of approximately 450 nm. However, when filtered, the white LEDs may have a dominant wavelength peak of approximately 580 nm.

A cutoff point for the filter may be calculated by determining what dominant wavelength peak is desired without sacrificing efficacy (lumens/watt). For example, filtering white LEDs may not provide any better efficacy than the yellow LEDs currently used in traffic signal lights. To resolve this problem, the cutoff point of the filter may be increased to approximately 550 nm+/−40 nm such that more light may be transmitted and the efficacy may be improved. One skilled in the art will recognize that the cutoff point can also be raised, lowered or modified to achieve a desired dominant wavelength peak or chromaticity coordinates.

However, the filtered white LED may have a dominant wavelength peak of approximately 580 nm resulting in a green-yellow color. To resolve this problem, the mixing lens 104 may be used to mix two light energies having different dominant wavelength peaks to achieve a light energy having a desired dominant wavelength peak, as discussed below.

Referring to the mixing lens 104, in an exemplary embodiment mixing lens 104 may be integrated into the outer lens 102 that also functions as the filter, as discussed above. In such an exemplary embodiment, outer lens 102 may comprise a scattered surface to mix the light energies of the first and second type of LEDs. In an alternate embodiment, the mixing lens 104 may be a separate lens such as, for example, a Fresnel lens.

Alternatively, mixing of the light energies emitted from the one or more first and second type of LEDs may occur without a physical device such as mixing lens 104. For example, mixing of the light energies emitted from the one or more first and second type of LEDs may be done by proper positioning of the one or more first and second type of LEDs. As such, one skilled in the art will recognize that any mechanism for overlapping or mixing light energies emitted from the one or more first and second type of LEDs may be used such as, for example, using a physical device or structure or using proper positioning of the one or more first and second type of LEDs.

The mixing lens 104 may combine the light energy having the first dominant wavelength peak emitted from the first type of LEDs and the light energy having the third dominant wavelength peak emitted from the filtered second type of LEDs to produce a light energy having a desired fourth dominant wavelength peak. For example, the fourth dominant wavelength peak may be desired because it falls within a pre-defined range, as discussed below.

In an exemplary embodiment, the first type of LEDs may be made of aluminum gallium phosphide (AlInGaP) and the second type of LEDs may be made of Indium gallium nitride (InGaN). However, LEDs 108 may be any combination of LEDs made of any type of materials typically used to construct LEDs.

FIG. 2 illustrates an exploded view of another exemplary signal light, e.g. a traffic signal light 200 according to one embodiment of the present invention. Traffic signal light 200 may be a traffic signal light utilizing 5 mm discrete LEDs 204. Traffic signal light 200 may comprise an outer lens 202, a reflector 206 for holding LEDs 204. Moreover, reflector 206 may be connected to a circuit board 208 via a plurality of wires 210. Similar to circuit board 110 discussed above, circuit board 208 may also include a processor for controlling LEDs 204. Reflector 206, circuit board 208 and the plurality of wires 210 may be enclosed in a housing 212.

Similar to LEDs 108 of traffic signal light 100 discussed above, LEDs 204 of traffic signal light 200 may also comprise one or more first type of LEDs and one or more second type of LEDs. The one or more first type of LEDs may emit a light energy having a first dominant wavelength peak and the one or more second type of LEDs may emit a light energy having a second dominant wavelength peak. In an exemplary embodiment of the present invention, the one or more first type of LEDs and the one or more second type of LEDs may be placed adjacently in reflector 206 in an alternating fashion. However, embodiments of the present invention are not limited to such an arrangement and LEDs 204 may be placed in reflector 206 in any way.

Moreover, one skilled in the art will recognize that traffic signal light 200 may be similar to traffic signal light 100 in all other respects except the type of LED that is used, e.g. Hi-Flux LEDs or 5 mm discrete LEDs. For example, although FIG. 2 does not illustrate a mixing lens 104, one skilled in the art will recognize that a mixing lens 104 may be added to traffic signal light 200, similar to traffic signal 100, in any configuration discussed above. Analogously, a filter may be included in traffic signal light 200 in any configuration similar to traffic signal light 100, as discussed above.

Consequently, the exemplary embodiment of the signal light illustrated in FIG. 1 and FIG. 2 may be more efficient than traffic signal lights currently used in the art. For example, a traffic signal light may comprise a red signal, a yellow signal and a green signal. Currently, yellow signal lights may be constructed with all yellow colored LEDs made from AlInGaP. However, traditional yellow LEDs made from AlInGaP suffer from light degradation at increased temperatures, as illustrated in FIG. 3.

Figure 3:
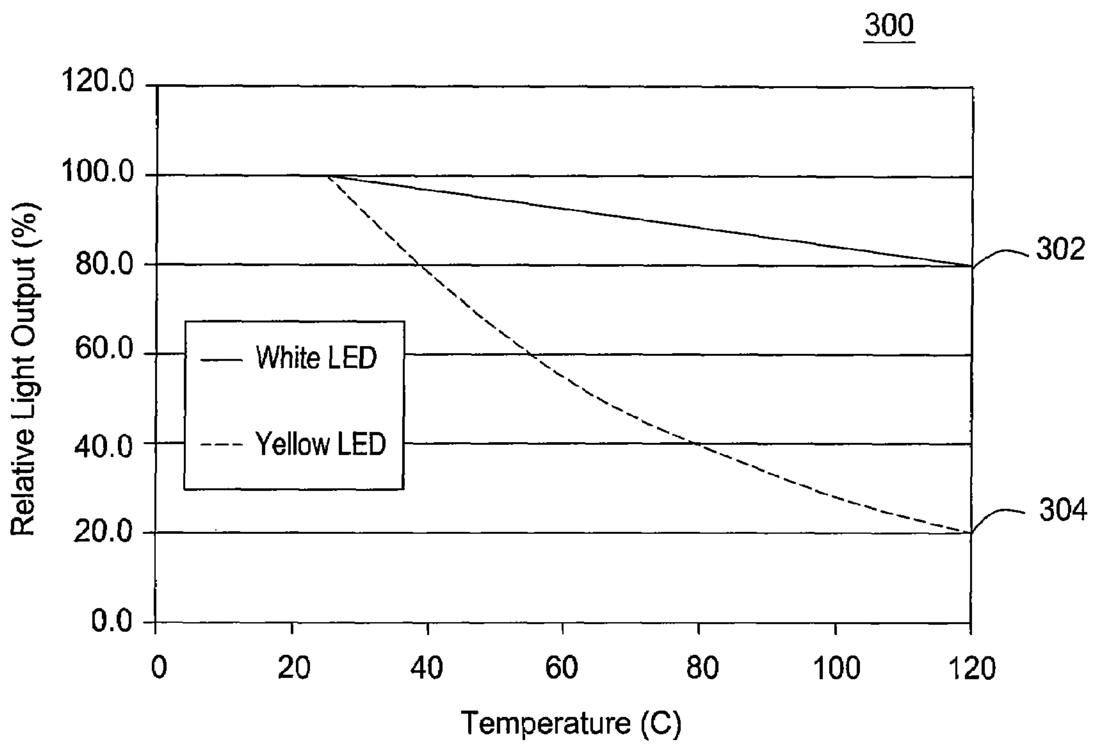
FIG. 3 illustrates a graph of exemplary light degradation of various LEDs.

FIG. 3 illustrates a graph 300 of exemplary light degradation of various LEDs. As discussed above, traffic lights may be exposed to high temperatures due to solar loading. Traditional yellow LEDs made from AlInGaP suffer from a rapid rate of light degradation as the temperature increases, as illustrated by line 304 of graph 300. As discussed above, traffic signal head temperatures can exceed 74° C. due to solar loading, internal heat and other factors. As shown by graph 300, at 74° C., a yellow LED made from AlInGaP may lose approximately 50% of its light output. In other words, at 74° C. a traffic signal head for yellow signal lights would require twice as many LEDs than would normally be required at room temperature.

However, LEDs made from InGaN have a higher efficiency than LEDs made from AlInGaP as temperatures increase. In other words, LEDs made from InGaN, such as white colored LEDs for example, have less light degradation as the temperature increases, as illustrated by line 302 in graph 300. As shown by graph 300, at 74° C. a white LED made from InGaN may lose only approximately 10% of its light output.

However, in an exemplary embodiment of the present invention, to use white colored LEDs made from InGaN, the white colored LEDs may be filtered such that only yellow colored light passes. However, the yellow colored light emitted from the filtered white LED may still be outside a pre-defined range. For example, the pre-defined range may be the wavelength requirements for traffic signals as defined by a regulatory agency or by a particular city. For example, some cities may require that a yellow signal light have a dominant wavelength peak of approximately 590 nm. However, the yellow light emitted from the filtered white LEDs may have a dominate wavelength peak of approximately 580 nm.

Figure 4:
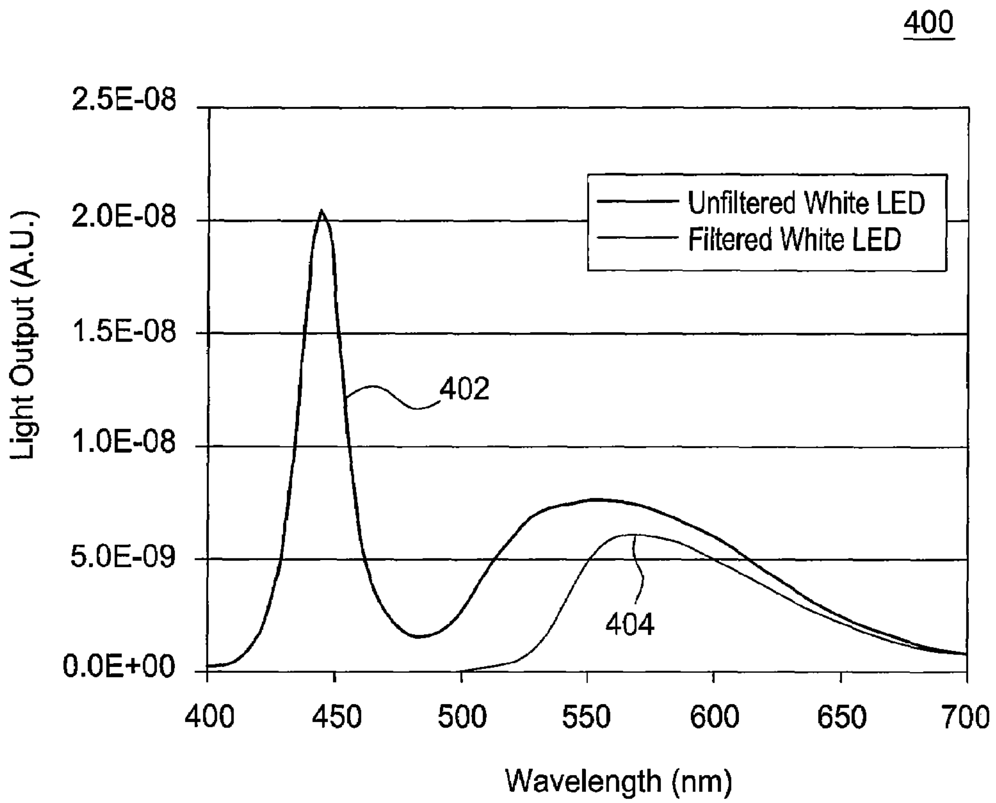
FIG. 4 illustrates a spectrum of an exemplary white LED before and after filtering.

FIG. 4 illustrates a graph 400 depicting a spectrum of an exemplary white LED before and after filtering. For example, an unfiltered white LED may have a dominate wavelength peak of approximately 450 nm as depicted by line 402 of graph 400. A filtered white LED may have a dominate wavelength peak of approximately 580 nm as depicted by line 404 of graph 400.

Figure 5:
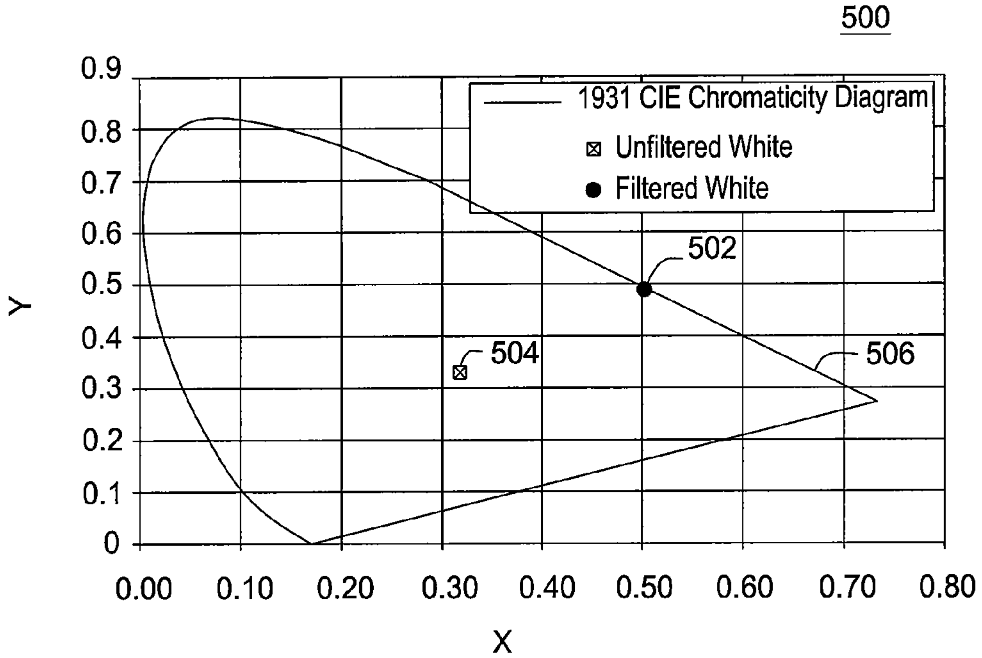
FIG. 5 illustrates exemplary coordinates of filtered and unfiltered white LEDs.

The color of the emitted light energy from an unfiltered and filtered LED may also be described in terms of coordinates of a chromaticity diagram, as illustrated in FIG. 5 for example. FIG. 5 illustrates a graph 500 depicting exemplary coordinates of filtered and unfiltered white LEDs. The coordinates are mapped on a 1931 CIE Chromaticity Diagram. Mark 504 of graph 500 illustrates approximate coordinates of an unfiltered white LED. Mark 502 of graph 500 illustrates approximate coordinates of a filtered white LED.

However, as noted above, using the filtered white LED made from InGaN may still emit light having a dominate wavelength peak that is outside of a pre-defined range. To create a light energy having a desired dominate wavelength peak, the light energy of the filtered white LED may be mixed with a light energy of another LED, as described above. For example, the other LED may be an orange-yellow LED having a dominate wavelength peak of approximately 595 nm. Although an orange-yellow LED and white LED are used in an exemplary embodiment of the present invention, one skilled in the art will recognize that any combination of colored LEDs may be used within the scope of the present invention. The color combination of the LEDs may be determined by a final desired color. For example, a different color combination of LEDs may be used to achieve a red signal light.

By mixing the filtered white LED light energy with the light energy of the orange-yellow LED, a light energy may be created having a desired dominate wavelength peak within the pre-defined range, e.g. approximately 590 nm. An example of this is illustrated in FIG. 6.

Figure 6:
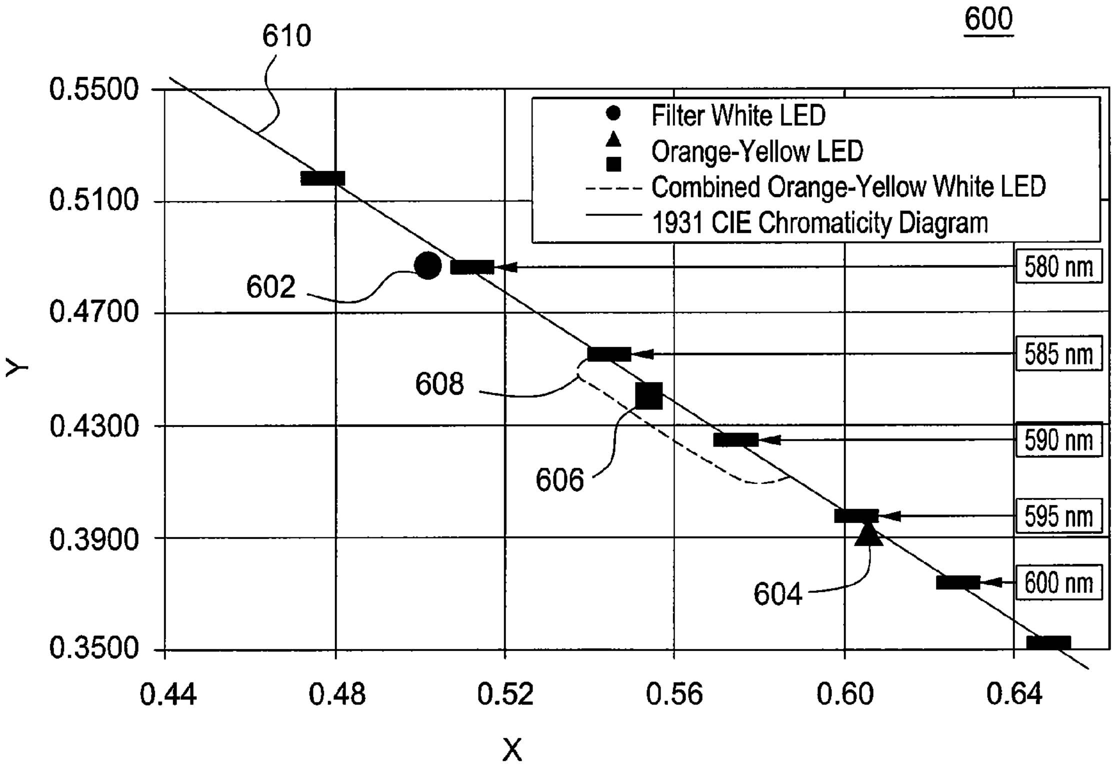
FIG. 6 illustrates exemplary coordinates of various LEDs.

FIG. 6 illustrates a graph 600 depicting exemplary coordinates of various LEDs on a chromaticity diagram. For example, graph 600 illustrates exemplary coordinates of a light energy of a filtered white LED, a light energy of an orange-yellow LED and a light energy created from mixing the light energy of the filtered white LED and the light energy of the orange-yellow LED. The exemplary coordinates are plotted against a close up of the 1931 CIE Chromaticity Diagram depicted by line 610 of graph 600. In addition, an exemplary pre-defined range, for example the required range for yellow traffic signals, is depicted by dashed line 608.

As discussed above, the light energy of a filtered white LED may have a dominant wavelength peak of approximately 580 nm, illustrated by mark 602. An exemplary range of chromaticity coordinates for a filtered white LED may be as shown below by Table 1.

TABLE 1

Exemplary range of chromaticity coordinates for a filtered white LED.

| x | y |
|---|---|
| 0.4 | 0.6 |
| 0.4 | 0.5 |
| 0.5 | 0.4 |
| 0.55 | 0.45 |
| 0.4 | 0.6 |

Although the filtered white LED may have a yellow color, the yellow color of the filtered white LED may still be outside the pre-defined range. For example, mark 602 is outside of the dashed line 608 representing the pre-defined range. However, a light energy from another LED, for example a light energy from an orange-yellow LED, may be mixed with the light energy from the filtered white LED. For example, the light energy from the orange-yellow LED may have a dominant wavelength peak of approximately 595 nm, illustrated by mark 604. An exemplary range of chromaticity coordinates for an orange-yellow LED may be as shown below by Table 2.

TABLE 2

Exemplary range of chromaticity coordinates for an orange-yellow LED.

| x | y |
|---|---|
| 0.5 | 0.4 |
| 0.5 | 0.5 |
| 0.65 | 0.35 |
| 0.6 | 0.3 |
| 0.5 | 0.4 |

Mixing the light energy from the orange-yellow LED with the light energy from the filtered white LED may create a new light energy having a dominate wavelength peak of approximately 590 nm, as illustrated by mark 606. The new light energy may have a dominate wavelength peak that falls within the pre-defined range. This is illustrated by mark 606 being within dashed-line 608 representing the pre-defined range. An exemplary range of chromaticity coordinates for the new light energy may be as shown below by Table 3.

TABLE 3

Exemplary range of chromaticity coordinates for an orange-yellow LED.

| x | y |
|---|---|
| 0.53 | 0.47 |
| 0.51 | 0.47 |
| 0.59 | 0.39 |
| 0.61 | 0.39 |
| 0.53 | 0.47 |

As a result, the exemplary embodiment of the signal light illustrated in FIG. 1 and FIG. 2 may be more efficient than traffic signal lights currently used in the art. For example, the traffic signal lights illustrated in FIG. 1 and FIG. 2 may have less light degradation and have a longer life due to the use of LEDs made from InGaN. Moreover, the combined use of AlInGaP LEDs and InGaN LEDs may still be combined to create a light energy having a dominate wavelength peak within a pre-defined range, for example a required range for yellow traffic lights.

Figure 7:
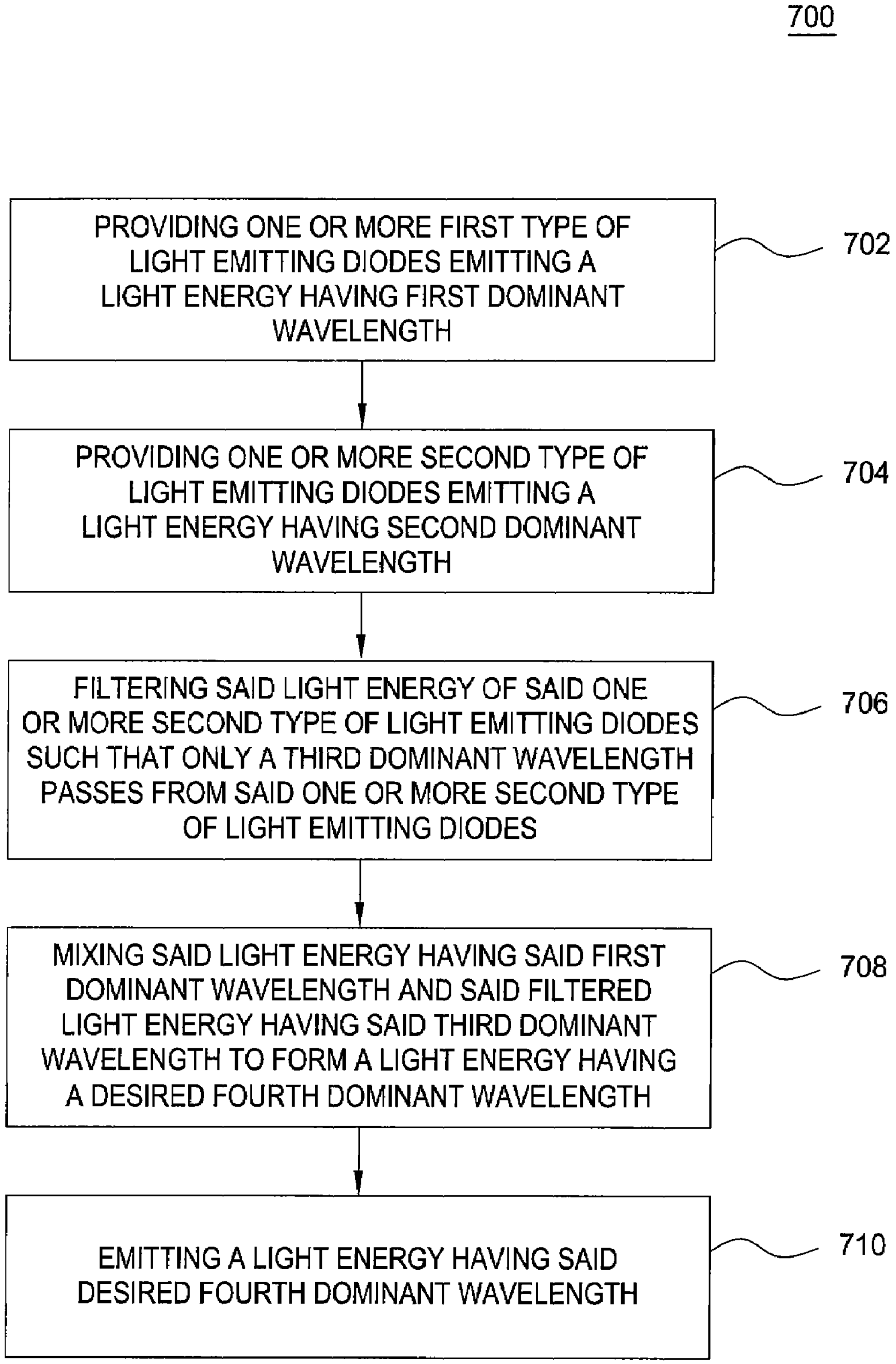
FIG. 7 illustrates a flow chart of an exemplary method of creating an improved traffic signal light as described herein.

FIG. 7 illustrates a flow chart of an exemplary method 700 of creating an improved traffic signal light as described herein. Method 700 begins at step 702 where one or more first type of light emitting diodes (LEDs) emitting a light energy having a first dominant wavelength peak may be provided. For example, the one or more first type of LEDs may be LEDs made from AlInGaP. Moreover, the first dominant wavelength peak may be approximately 595 nm having an orange-yellow color, for example.

At step 704, method 700 may provide one or more second type of LEDs emitting a light energy having a second dominant wavelength peak. In an exemplary embodiment, the one or more second type of LEDs may be made from InGaN. The second dominant wavelength peak may be approximately 450 nm having a white color, for example.

At step 706, method 700 may filter said light energy of said one or more second type of LEDs such that only a third dominant wavelength peak passes from said one or more second type of LEDs. For example, where the second type of LEDs are white InGaN LEDs, the light energy from the white InGaN LEDs may be filtered such that the white InGaN LEDs may have a dominant wavelength peak of approximately 580 nm instead of the previous dominant wavelength peak of approximately 450 nm. A dominant wavelength peak of approximately 580 nm may represent a light energy from a white InGaN LED having all but a yellow colored portion of the light energy filtered out, for example.

The one or more second type of LEDs may be filtered in any manner, as discussed above. Moreover, the filter may be integrated into an outer lens, may be a separate lens located anywhere between the LEDs and the outer lens or may be placed directly over each LED, as discussed above.

At step 708, method 700 mixes said light energy having said first dominant wavelength peak and said filtered light energy having said third dominant wavelength peak to form a light energy having a desired fourth dominant wavelength peak. For example, a light energy from an orange-yellow LED may be mixed with a light energy from a filtered white LED, as discussed above, to form a new light energy having a new dominant wavelength peak. The new dominant wavelength peak may be approximately 590 nm and may represent a yellow color. The new dominant wavelength peak may be desired because it may fall within a pre-defined range such as, for example, a wavelength requirement for yellow traffic signal lights.

The mixing may be performed by a mixing lens, as discussed above. For example, the mixing lens may be integrated into the outer lens or the mixing lens may be a separate lens such as, for example, a Fresnel lens.

At step 710, method 700 may conclude by emitting a light energy having said desired fourth dominant wavelength peak. For example, a traffic signal light or a rail signal may emit a light energy having a dominant wavelength peak of approximately 590 nm having a yellow color.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

The invention claimed is:

1. A signal light comprising:

a housing;

one or more first type of light emitting diodes (LEDs) emitting a light energy having a first dominant wavelength deployed in said housing;

one or more second type of LEDs emitting a light energy having a second dominant wavelength deployed in said housing, wherein said one or more second type of LEDs comprise a blue LED coated with a yellow phosphor;

a filter, wherein said filter filters said light energy of said one or more second type of LEDs such that only a third dominant wavelength passes from said one or more second type of LEDs; and a mixer, wherein said mixer mixes said light energy having said first dominant wavelength and said filtered light energy having said third dominant wavelength to form a light energy having a desired fourth dominant wavelength.

2. The signal light of claim 1, comprising:

an outer lens attached to said housing, wherein said filter and said mixer are integrated into said outer lens.

3. The signal light of claim 2, wherein said outer lens comprises a scattered surface to mix said light energy having said first dominant wavelength and said filtered light energy having said third dominant wavelength.

4. The signal light of claim 1, wherein said filter is located between said one or more first and second type of LEDs and at least one lens.

5. The signal light of claim 1, wherein said filter is located directly on each one of said one or more second type of LEDs.

6. The signal light of claim 1, wherein said filter is a colored filter or dichroic filter.

7. The signal light of claim 1, wherein said mixer is deployed in a Fresnel lens and said filter is deployed in an outer lens.

8. The signal light of claim 1, wherein said mixer and said filter are deployed in a Fresnel lens.

9. The signal light of claim 1, wherein said filter is deployed in a Fresnel lens.

10. The signal light of claim 9, wherein said outer lens diffracts light into a desired angular direction.

11. The signal light of claim 1, wherein said one or more first type of LEDs comprise aluminum indium gallium phosphide (AlInGaP) and said one or more second type of LEDs comprise indium gallium nitride (InGaN).

12. The signal light of claim 1, wherein said first dominant wavelength is approximately 595 nanometers having an orange-yellow color.

13. The signal light of claim 12, wherein said light energy having said first dominant wavelength comprises x and y coordinates in accordance with a 1931 CIE Chromaticity Diagram within boundaries of:

| x | y |
|---|---|
| 0.3 | 0.2 |
| 0.2 | 0.3 |
| 0.4 | 0.5 |
| 0.5 | 0.4 |
| 0.3 | 0.2. |

14. The signal light of claim 1, wherein said third dominant wavelength is approximately 580 nanometers having a yellow-green color.

15. The signal light of claim 14, wherein said light energy having said third dominant wavelength comprises x and y coordinates in accordance with a 1931 CIE Chromaticity Diagram within boundaries of:

| x | y |
|---|---|
| 0.4 | 0.6 |
| 0.4 | 0.5 |
| 0.5 | 0.4 |
| 0.55 | 0.45 |
| 0.4 | 0.6. |

16. The signal light of claim 1, wherein said fourth dominant wavelength is approximately 590 nanometers having a yellow color.

17. The signal light of claim 16, wherein said light energy of said desired fourth wavelength comprises x and y coordinates in accordance with a 1931 CIE Chromaticity Diagram within boundaries of:

| x | y |
|---|---|
| 0.53 | 0.47 |
| 0.51 | 0.47 |
| 0.59 | 0.39 |
| 0.61 | 0.39 |
| 0.53 | 0.47. |

18. A signal light comprising:

a housing;

one or more light emitting diodes (LEDs) emitting a light energy having a dominant wavelength of approximately 595 nanometers (nm) deployed in said housing;

one or more LEDs emitting a light energy having a dominant wavelength of approximately 450 nm deployed in said housing;

a filter, wherein said filter filters said light energy of said one or more LEDs having a dominant wavelength of approximately 450 nm such that only a light energy having a dominant wavelength of approximately 580 nm passes; and a mixer, wherein said mixer mixes said light energy having said dominant wavelength of approximately 595 nm and said light energy having said dominant wavelength of approximately 580 nm to form a light energy having a dominant wavelength of approximately 590 nm.

19. A signal light comprising:

a housing;

one or more first type of light emitting diodes (LEDs) emitting a light energy having a first dominant wavelength deployed in said housing;

one or more second type of LEDs emitting a light energy having a second dominant wavelength deployed in said housing;

a filter, wherein said filter filters said light energy of said one or more second type of LEDs such that only a third dominant wavelength passes from said one or more second type of LEDs; and a mixer, wherein said mixer mixes said light energy having said first dominant wavelength and said filtered light energy having said third dominant wavelength to form a light energy having a desired fourth dominant wavelength, wherein said mixer is deployed in a Fresnel lens and said filter is deployed in an outer lens.

20. A signal light comprising:

a housing;

one or more first type of light emitting diodes (LEDs) emitting a light energy having a first dominant wavelength deployed in said housing;

one or more second type of LEDs emitting a light energy having a second dominant wavelength deployed in said housing;

a filter, wherein said filter filters said light energy of said one or more second type of LEDs such that only a third dominant wavelength passes from said one or more second type of LEDs; and a mixer, wherein said mixer mixes said light energy having said first dominant wavelength and said filtered light energy having said third dominant wavelength to form a light energy having a desired fourth dominant wavelength, wherein said mixer and said filter are deployed in a Fresnel lens.

21. A signal light comprising:

a housing;

one or more first type of light emitting diodes (LEDs) emitting a light energy having a first dominant wavelength deployed in said housing;

one or more second type of LEDs emitting a light energy having a second dominant wavelength deployed in said housing;

a filter, wherein said filter filters said light energy of said one or more second type of LEDs such that only a third dominant wavelength passes from said one or more second type of LEDs; and a mixer, wherein said mixer mixes said light energy having said first dominant wavelength and said filtered light energy having said third dominant wavelength to form a light energy having a desired fourth dominant wavelength, wherein said filter is deployed in a Fresnel lens.

22. The signal light of claim 21, wherein said outer lens diffracts light into a desired angular direction.

* * * * *

UNITED STATES PATENT AND TRADEMARK OFFICE

CERTIFICATE OF CORRECTION

PATENT NO. : 7,777,322 B2
APPLICATION NO. : 11/618552
DATED : August 17, 2010
INVENTOR(S) : John W. Curran et al.

It is certified that error appears in the above-identified patent and that said Letters Patent is hereby corrected as shown below:

Column 8, line 42, in Claim 11, line 2, delete “(AIInGaP)” and insert instead --(AlInGaP)--.

Signed and Sealed this
Twenty-second Day of February, 2011

David J. Kappos
*Director of the United States Patent and Trademark Office*